(12) United States Patent
Mugiya et al.

(10) Patent No.: US 8,536,959 B1
(45) Date of Patent: Sep. 17, 2013

(54) SUBSTRATE WITH BUILT-IN ELECTRONIC COMPONENT

(75) Inventors: Eiji Mugiya, Tokyo (JP); Tetsuo Saji, Tokyo (JP); Takashi Matsuda, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/589,531

(22) Filed: Aug. 20, 2012

(30) Foreign Application Priority Data

Aug. 10, 2012 (JP) ................................. 2012-177965

(51) Int. Cl.
*H03H 9/00* (2006.01)
*H01L 41/00* (2013.01)

(52) U.S. Cl.
USPC .......................................... 333/186; 310/326

(58) Field of Classification Search
USPC ................. 333/133, 193, 194, 195, 196, 186; 310/313 R, 313 B, 326
See application file for complete search history.

(56) References Cited

U.S. PATENT DOCUMENTS

| | | | | |
|---|---|---|---|---|
| 7,230,512 | B1 * | 6/2007 | Carpenter et al. | 333/193 |
| 7,385,463 | B2 * | 6/2008 | Koga et al. | 333/193 |
| 7,427,824 | B2 * | 9/2008 | Iwamoto et al. | 310/344 |
| 7,999,632 | B2 * | 8/2011 | Iwamoto | 333/133 |
| 8,004,160 | B2 * | 8/2011 | Tsuda et al. | 310/348 |
| 8,384,272 | B2 * | 2/2013 | Fukano et al. | 310/344 |

FOREIGN PATENT DOCUMENTS

JP    2011-176061 A    9/2011

* cited by examiner

*Primary Examiner* — Dean O Takaoka
(74) *Attorney, Agent, or Firm* — Chen Yoshimura LLP (57) ABSTRACT

Provided is a substrate with a built-in electronic component that can minimize occurrence of functional anomaly, damage, or the like in a filter function section of an elastic wave filter that is caused by a deformation of a hollow cover of the elastic wave filter that is built into the substrate. The substrate with a built-in electronic component includes: an SAW filter built into a substrate, a filter function section of the SAW filter being covered by a hollow cover; and a stress absorbing layer that faces the hollow cover of the SAW filter through an insulating layer in the substrate.

8 Claims, 7 Drawing Sheets

SUBSTRATE WITH BUILT-IN ELECTRONIC COMPONENT

This application claims the benefit of Japanese Application No. 2012-177965, filed in Japan on Aug. 10, 2012, which is hereby incorporated by reference in its entirety.

TECHNICAL FIELD

The present invention relates to a substrate with a built-in electronic component in which an electronic component is built into the substrate, and more particularly, to a substrate with a built-in electronic component in which an elastic wave filter that is configured such that a filter function section thereof is covered by a hollow cover is built into a substrate.

BACKGROUND ART

Elastic wave filters that are drawing attention as high-frequency filters, such as an SAW filter utilizing surface acoustic waves and a BAW filter utilizing bulk acoustic waves, for example, were large in size, and were therefore typically mounted on the top surface of a substrate (see Patent Document 1 below). However, in recent years, along with the reduction in size of the elastic wave filters, which was made possible by advancement of the wafer level package technology, development of a technology to incorporate the elastic wave filter in the substrate in the same manner as small electronic components such as capacitors, inductors, and resistors has been pursued.

However, because a typical elastic wave filter is configured such that a filter function section thereof is covered by a hollow cover, the following problem may arise when the elastic wave filter is built into the substrate.

When the elastic wave filter is built into the substrate such that the hollow cover faces up, for example, the substrate with a built-in electronic component has at least an insulating layer above the elastic wave filter. On the top surface of this substrate with a built-in electronic component, large electronic components such as an IC chip are mounted as needed, in addition to small electronic components. When an external force is applied downwardly to the top surface of the substrate with a built-in electronic component during, before, or after such a mounting step or the like, downward stress resulting from the external force acts on the hollow cover of the elastic wave filter. As a result, the hollow cover may be pressed and deformed, which may cause functional anomaly, damage, and the like in the filter function section.

RELATED ART DOCUMENT

Patent Document

Patent Document 1: Japanese Patent Application Laid-Open Publication No. 2011-176061

SUMMARY OF THE INVENTION

Problems to be Solved by the Invention

An object of the present invention is to provide a substrate with a built-in electronic component that can minimize occurrence of functional anomaly, damage, or the like in a filter function section of an elastic wave filter, which is caused by a deformation of a hollow cover of the elastic wave filter that is built in the substrate.

Means for Solving the Problems

In order to achieve the above-mentioned object, a substrate with a built-in electronic component of the present invention includes: an elastic wave filter built into a substrate, a filter function section of the elastic wave filter being covered by a hollow cover; and a stress absorbing layer that faces the hollow cover of the elastic wave filter through an insulating layer in the substrate.

Effects of the Invention

According to the present invention, because the stress absorbing layer is disposed to face the hollow cover of the elastic wave filter through the insulating layer in the substrate, even when an external force is applied to the substrate with a built-in electronic component during, before, or after mounting an electronic component on the substrate with a built-in electronic component or the like, and even if stress acts on the hollow cover of the elastic wave filter as a result of the external force, the stress can be received and absorbed by the stress absorbing layer. This makes it possible to reliably prevent the hollow cover of the elastic wave filter from being pressed and deformed, and as a result, functional anomaly, damage, and the like caused by the deformation can be reliably prevented from occurring in the filter function section.

The above-mentioned object, other objects, features, and effects of the present invention will become apparent from the descriptions that follow and the appended drawings.

DETAILED DESCRIPTION OF EMBODIMENTS

Embodiment 1

Figure 1A:
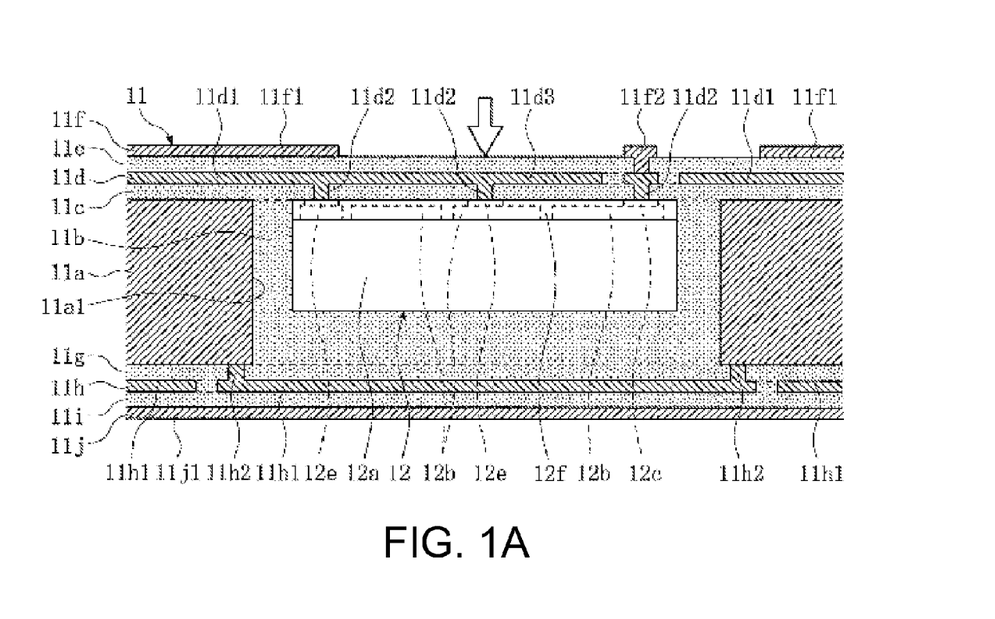
FIG. 1A is a vertical cross-sectional view of a main portion of a substrate with a built-in electronic component according to Embodiment 1 of the present invention.

FIGS. 1A, 1B, 2A, and 2B show Embodiment 1 of the present invention (substrate with a built-in electronic component). In the figures, the reference character 11 represents a substrate having a multi-layer structure, and the reference character 12 represents an SAW filter that is built in the substrate 11. FIG. 1A is a cross-sectional view along the line A-A in FIG. 1B, but in FIG. 1A, the cross section of the SAW filter 12 is not shown.

As shown in FIG. 1A, the substrate 11 includes a core layer 11a in which a housing portion 11a1 in a substantially cuboid shape is formed to penetrate the core layer 11a, a part fixing portion 11b disposed in a gap between the SAW filter 12 housed in the housing portion 11a1 and an inner wall of the housing portion 11a1, a first insulating layer 11c formed on the top surface (first main surface) of the core layer 11a, a first conductive layer 11d formed on the top surface of the first insulating layer 11c, a second insulating layer 11e formed on the top surface of the first conductive layer 11d, a second conductive layer 11f formed on the top surface of the second insulating layer 11e, a third insulating layer 11g formed on the bottom surface (second main surface) of the core layer 11a, a third conductive layer 11h formed on the bottom surface of the third insulating layer 11g, a fourth insulating layer 11i formed on the bottom surface of the third conductive layer 11h, and a fourth conductive layer 11j formed on the bottom surface of the fourth insulating layer 11i.

The core layer 11a is made of a metal such as copper or a copper alloy, and the thickness thereof is in a range of 100 to 400 μm, for example. The part fixing portion 11b is made of a thermosetting plastic such as an epoxy resin, a polyimide, a bismaleimide-triazine resin, or plastic that is obtained by adding fillers for reinforcement to any of these resins. The respective insulating layers 11c, 11e, 11g, and 11i are made of a thermosetting plastic, such as an epoxy resin, a polyimide, a bismaleimide-triazine resin, or plastic that is obtained by adding fillers for reinforcement to any of these resins, and the thickness thereof is in a range of 10 to 30 μm, for example. The respective conductive layers 11d, 11f, 11h, and 11j are made of a metal such as copper or a copper alloy, and the thickness thereof is in a range of 5 to 25 μm, for example.

In the respective conductive layers 11d, 11f, 11h, and 11j, wiring lines 11d1, 11f1, 11h1, and 11j1 that are used as signal wiring lines or ground wiring lines are patterned two-dimensionally. In the ground wiring line 11d1 that is included in the first conductive layer 11d, a stress absorbing layer 11d3 that faces the top surfaces of the respective hollow covers 12b of the SAW filter 12 through the first insulating layer 11c is formed continuously from the ground wiring line 11d1, as described below.

In the respective insulating layers 11c, 11e, 11g, and 11i, via conductors 11d2, 11f2, and 11h2 are formed (via conductor of the wiring line 11j1 is not shown). The respective via conductors may or may not be formed continuously from the wiring lines 11d1, 11f1, 11h1, or 11j1. The respective via conductors 11d2, 11f2, and 11h2 are made of a metal such as copper or a copper alloy, and the maximum diameter thereof is in a range of 10 to 30 μm, for example.

Respective gaps between the wiring lines 11d1, 11f1, 11h1, and 11j1, and gaps between the wiring lines 11d1, 11f1, 11h1, and 11j1 and pad portions of the via conductors 11d2, 11f2, and 11h2 that are separated from the wiring lines are filled with a thermosetting plastic, such as an epoxy resin, a polyimide, a bismaleimide-triazine resin, or plastic that is obtained by adding fillers for reinforcement to any of these resins.

Figure 2A:
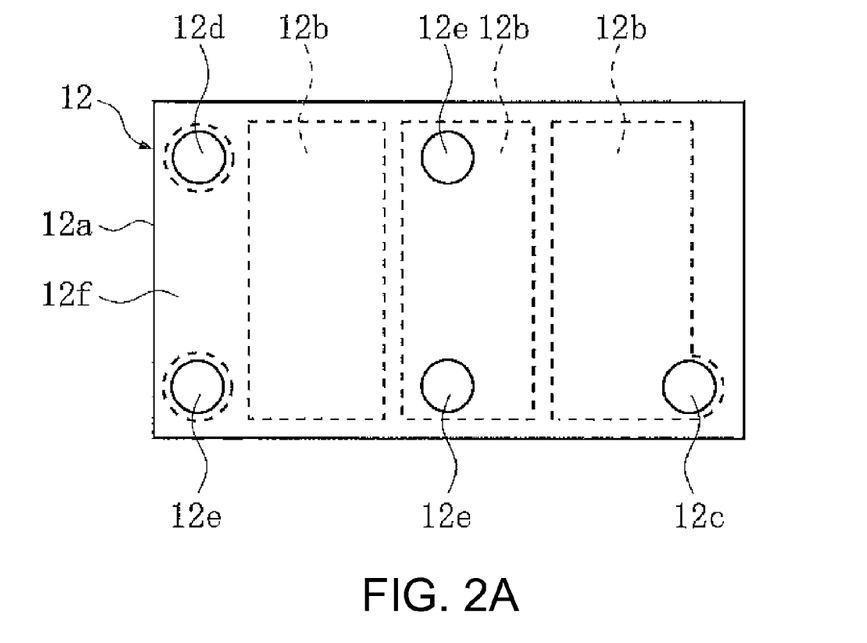
FIG. 2A is a top view of the SAW filter shown in FIG. 1A.

As shown in FIGS. 1A and 2A, the SAW filter 12 includes a substantially cuboid shaped filter main body 12a that is made of a piezoelectric body such as lithium tantalate or lithium niobate, a filter function section (no reference character is given) formed on the top surface of the filter main body 12a, three hollow covers 12b that cover the filter function section, an input terminal 12c (first terminal), an output terminal 12d (second terminal), three ground terminals 12e (third terminals), and a sealing portion 12f formed on the top surface of the filter main body 12a. The SAW filter 12 is formed in a substantially cuboid shape as a whole. In one exemplary configuration, at least two ground terminals 12e (two ground terminals 12e in the center of FIG. 2A) of the three ground terminals 12e are connected to the hollow cover 12b.

Figure 2B:
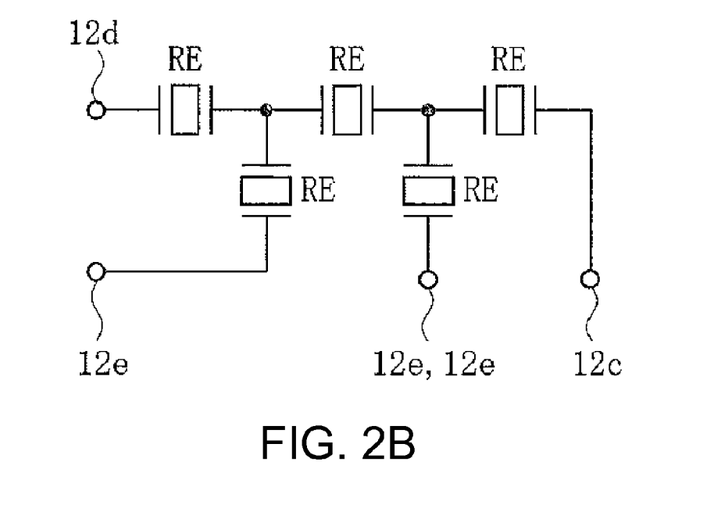
FIG. 2B is a diagram showing a configuration of a filter function section of the SAW filter shown in FIG. 2A.

As shown in FIG. 2B, the filter function section has a ladder structure in which three resonators RE are connected in series and two resonators RE are connected in parallel thereto, for example. Each resonator RE is made of a comb-shaped electrode and reflectors placed on the opposing sides thereof.

Each hollow cover 12b includes a seal ring (not shown) that is formed in a substantially rectangular frame shape and that is attached to the top surface of the filter main body 12a and a cover plate (not shown) that is attached to the seal ring to cover the top opening thereof. The height of each cover is in a range of 10 to 30 μm, for example. The seal ring and the cover plate are made of a metal such as copper, nickel, gold, or an alloy thereof. That is, the SAW filter 12 has a structure in which the filter function section is covered by the respective hollow covers 12b, and the filter function section is placed in hollows formed by the respective hollow covers 12b.

The sealing portion 12f is disposed on the top surface of the filter main body 12a so as to cover the respective hollow covers 12b, and the respective terminals 12c to 12e are exposed from the top surface of the sealing portion 12f. The sealing portion 12f is made of a thermoplastic material that has high humidity resistance such as liquid crystal polymers, syndiotactic polystyrene, polyphenylene sulfide, polyetheretherketone, or polyethere nitrile, and the height thereof from the top surfaces of the respective hollow covers 12b is in a range of 10 to 50 μm, for example.

This SAW filter 12 is housed in the housing portion 11a1 such that the respective hollow covers 12b covering the filter function section face up and such that the top surface thereof is substantially flush with the top surface of the core layer 11a. The top surface of the sealing portion 12f is covered by the first insulating layer 11c. The input terminal 12c of the SAW filter 12 is connected to the via conductor 11f2 that is exposed from the top surface of the substrate 11 through the via conductor 11d2. Although not shown in the figure, the output terminal 12d is also connected to a via conductor 11f2 that is exposed from the top surface of the substrate 11 through the via conductor 11d2. Also, the respective ground terminals 12e of the SAW filter 12 are connected to the stress absorbing layer 11d3 through the via conductor 11d2.

The positional relationship of the SAW filter 12 and the stress absorbing layers 11d3 and the like in the substrate with a built-in electronic component shown in FIG. 1A will be explained with reference to FIGS. 1A and 1B.

The stress absorbing layer 11d3 has a substantially rectangular shape that is larger than the shape of the top surface of the SAW filter 12, and is formed continuously from the ground wiring line 11d1 that is included in the first conductive layer 11*d*. Because the stress absorbing layer 11*d*3 is constituted of a part of the first conductive layer 11*d*, the stress absorbing layer 11*d*3 is made of the same metal as the wiring line 11*d*1 (first conductive layer 11*d*), and has substantially the same thickness as that of the wiring line 11*d*1 (first conductive layer 11*d*).

That is, because the stress absorbing layer 11*d*3 is made of the same metal as the wiring line 11*d*1 (first conductive layer 11*d*), the Young's modulus of the stress absorbing layer 11*d*3 is higher than the Young's modulus of the first insulating layer 11*c* and the second insulating layer 11*e* (both made of plastic).

The via conductors 11*d*2, which are respectively connected to the input terminal 12*c* and the output terminal 12*d* of the SAW filter 12, and circular spaces surrounding the via conductors 11*d*2 are included in the stress absorbing layer 11*d*3. The stress absorbing layer 11*d*3 faces the substantially entire top surface area of the three hollow covers 12*b* of the SAW filter 12 in a substantially parallel manner. Spacing between the stress absorbing layer 11*d*3 and the top surfaces of the hollow covers 12*b* substantially corresponds to a sum of the thickness of the first insulating layer 11*c* and the thickness of the sealing portion 12*f* over the top surfaces of the hollow covers 12*b*.

On the top surface of the substrate with a built-in electronic component shown in FIG. 1A, large electronic components such as an IC chip are mounted as needed, in addition to small electronic components such as capacitors, inductors, and resistors. If an external force as indicated with the white arrow in FIG. 1A is applied to the top surface of the substrate with a built-in electronic component in the mounting step, a step before or after the mounting step, or the like, this external force produces downward stress that could act on the respective hollow covers 12*b* of the SAW filter 12.

(Effect 1) However, in the substrate with a built-in electronic component described above, the stress absorbing layer 11*d*3 that faces the top surfaces of the respective hollow covers 12*b* of the SAW filter 12 is disposed above the first insulating layer 11*c*, and therefore, even if the downward stress that could act on the respective hollow covers 12*b* of the SAW filter 12 is produced, the downward stress is received and absorbed by the stress absorbing layer 11*d*3. This makes it possible to reliably prevent the respective hollow covers 12*b* of the SAW filter 12 from being pressed and deformed, and as a result, functional anomaly, damage, and the like caused by the deformation can be reliably prevented from occurring in the filter function section.

That is, after received by the stress absorbing layer 11*d*3, the stress is distributed throughout the entire surface the stress absorbing layer 11*d*3. Therefore, when the stress is applied to the hollow covers 12*b* of the SAW filter 12 through the stress absorbing layer 11*d*3, the force per unit area of the top surfaces of the respective hollow covers 12*b* is reduced. As a result, the respective hollow covers 12*b* can be reliably prevented from being pressed and deformed by the stress.

The above-mentioned effect, which is achieved by the stress absorbing layer 11*d*3, makes it possible to eliminate the limitation on locations of the SAW filter 12 in the substrate with a built-in electronic component, leading to an advantage of the higher degree of freedom in designing the arrangement of the SAW filter 12.

In the substrate with a built-in electronic component, if the second insulating layer 11*e* is to be made of an "intermediate material of thermosetting plastic that can be shaped by heat and pressure and that can be cured by heat," downward stress that could act on the respective hollow covers 12*b* of the SAW filter 12 is produced as a result of the pressure application in the step of forming the layer. However, in this case, the downward stress can be received and absorbed by the stress absorbing layer 11*d*3. This makes it possible to reliably prevent the respective hollow covers 12*b* of the SAW filter 12 from being pressed and deformed, and as a result, functional anomaly, damage, and the like caused by the deformation can be reliably prevented from occurring in the filter function section.

(Effect 2) The stress absorbing layer 11*d*3 is substantially parallel to the top surfaces of the respective hollow covers 12*b*, and the Young's modulus of the stress absorbing layer 11*d*3 is higher than the Young's modulus of the first insulating layer 11*c*, which allows the stress absorbing layer 11*d*3 to effectively perform the stress absorbing function. Therefore, the deformation of the respective hollow covers 12*b* can be prevented more reliably, and as a result, it becomes possible to more reliably prevent functional anomaly, damage, and the like in the filter function section, which would be caused by the deformation.

(Effect 3) In the above-mentioned substrate with a built-in electronic component, the stress absorbing layer 11*d*3 is constituted of a part of the first conductive layer 11*d*, and is formed continuously from the ground wiring line 11*d*1 included in the first conductive layer 11*d*. Therefore, the stress absorbing layer 11*d*3 can be formed with ease when the wiring lines are formed by patterning the first conductive layer 11*d*.

Figure 1B:
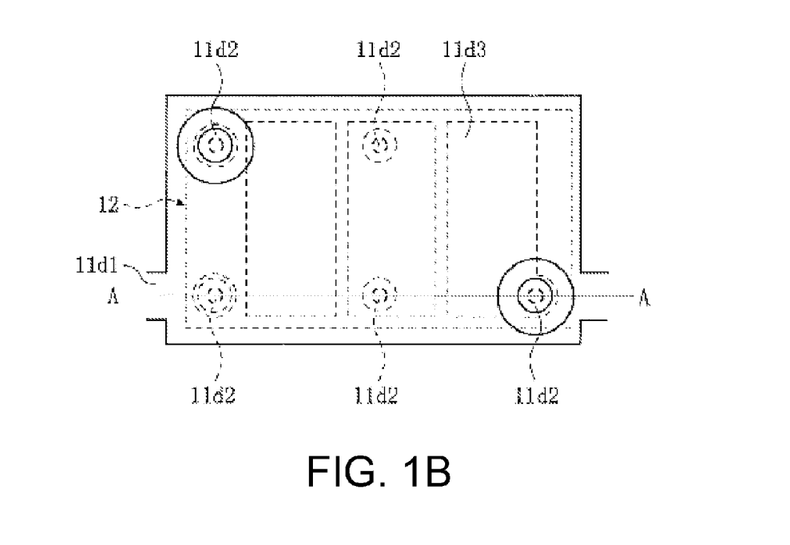
FIG. 1B is a diagram for illustrating the positional relationship of an SAW filter and a stress absorbing layer and the like in the substrate with a built-in electronic component shown in FIG. 1A.

The SAW filter 12 shown in FIGS. 1 and 2 is provided with a total of three hollow covers 12*b*, but even when the SAW filter 12 is replaced by an SAW filter 12-1 that has a total of five hollow covers 12*b* (see FIG. 3A), or an SAW filter 12-2 that has one hollow cover 12*b* (see FIG. 3B), that is, even when the SAW filter 12 is replaced by another SAW filter that has at least one hollow cover 12*b* that covers the filter function section, effects similar to the effects 1 to 3 above can be obtained. In one exemplary configuration, in the SAW filter 12-1 shown in FIG. 3A, at least two ground terminals 12*e* (two ground terminals 12*e* in the center of FIG. 3A) of the three ground terminals 12*e* are connected to the hollow cover 12*b*. In the SAW filter 12-2 shown in FIG. 3B, at least one ground terminal 12*e* (one ground terminal 12*e* in the center of FIG. 3B) of the two ground terminals 12*e* is connected to the hollow cover 12*b*.

Figure 3A:
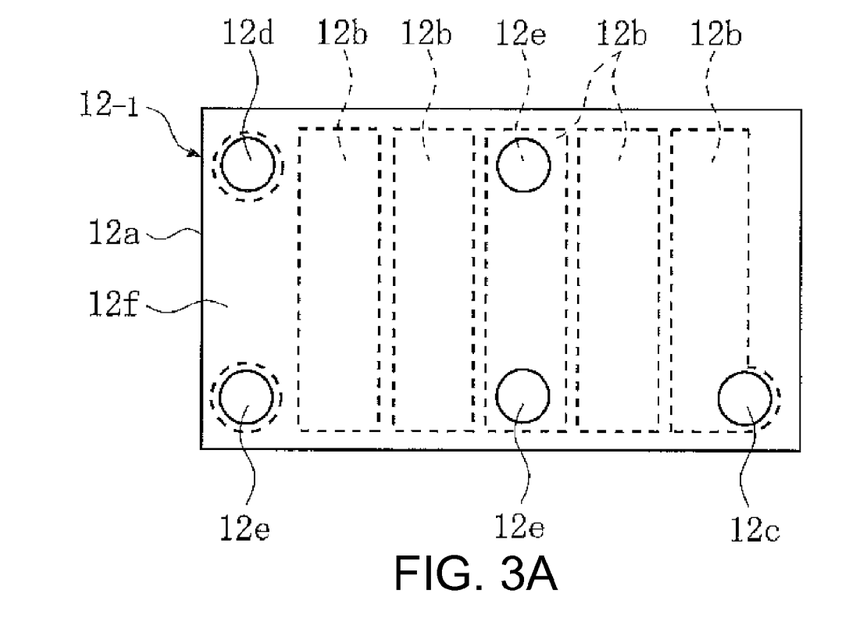
FIGS. 3A and 3B are top views of other SAW filters that can be used in place of the SAW filter shown in FIG. 1A.
Figure 3B:
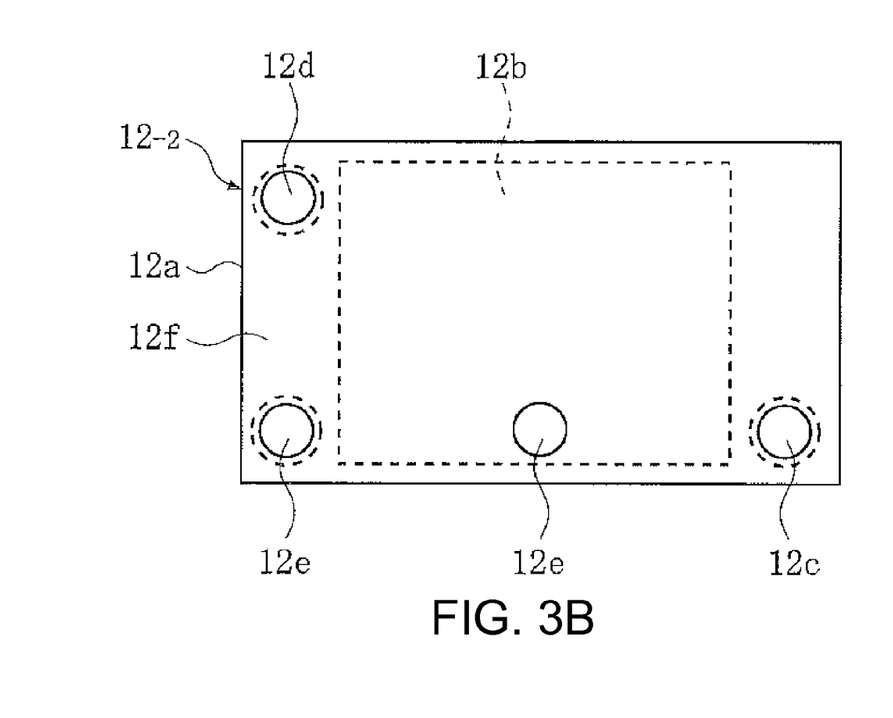

The SAW filters 12 and 12-1 that respectively have three ground terminals 12*e* and the SAW filter 12-2 that has two ground terminals 12*e* are shown in FIGS. 1 to 3. However, even when an SAW filter that has one ground terminal 12*e* or four or more ground terminals 12*e* is used instead, that is, even when an SAW filter that has at least one ground terminal 12*e* on the top surface of the hollow cover 12*b* is used instead, effects similar to the effects 1 to 3 above can be obtained regardless of quantities of the input terminal 12*c* and the output terminal 12*d*.

In FIG. 1, the stress absorbing layer 11*d*3 is shown to have a shape that is larger than the shape of the top surface of the SAW filter 12. However, effects similar to the effects 1 to 3 above can be obtained regardless of the outline shape or location of the stress absorbing layer 11*d*3, as long as the stress absorbing layer 11*d*3 has a shape that allows it to face at least about two thirds, more preferably, at least about three quarters of the total area of the top surfaces of the hollow covers 12*b* regardless of the number of the hollow cover 12*b*.

In FIGS. 1 to 3, the SAW filters 12, 12-1, and 12-2 are shown as the elastic wave filter in which the filter function section is covered by the hollow cover. However, effects similar to the effects 1 to 3 above can be obtained even when a BAW filter or an elastic wave filter of other types that has at least one hollow cover that covers the filter function section is used instead of the SAW filter.

Embodiment 2

Figure 4A:
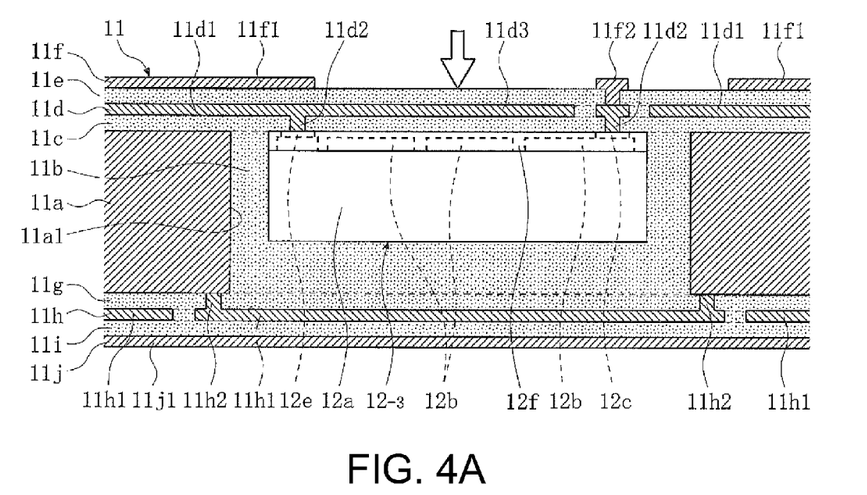
FIG. 4A is a vertical cross-sectional view of a main portion of a substrate with a built-in electronic component according to Embodiment 2 of the present invention.

FIGS. 4A, 4B, 5A, and 5B show Embodiment 2 of the present invention (substrate with a built-in electronic component). The substrate with a built-in electronic component according to Embodiment 2 differs from the substrate with a built-in electronic component of Embodiment 1 in that an SAW filter 12-3 (see FIGS. 4A, 4B, and 5A) that does not have a ground terminal 12e on the top surfaces of a total of three hollow covers 12b is used instead of the SAW filter 12. FIG. 4A is a cross-sectional view along the line A-A in FIG. 4B, but the details of the cross section of the SAW filter 12-3 is not shown in FIG. 4A.

Figure 5A:
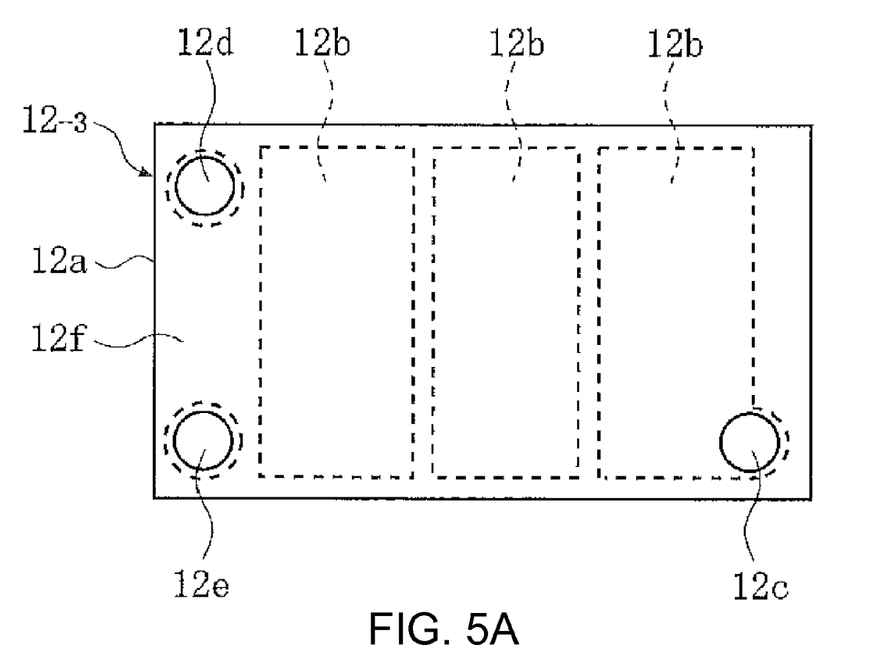
FIG. 5A is a top view of the SAW filter shown in FIG. 4A.

As shown in FIGS. 4A and 5A, the SAW filter 12-3 includes a substantially cuboid shaped filter main body 12a that is made of a piezoelectric body such as lithium tantalate or lithium niobate, a filter function section (no reference character is given) formed on the top surface of the filter main body 12a, three hollow covers 12b that cover the filter function section, an input terminal 12c, an output terminal 12d, a ground terminal 12e, and a sealing portion 12f formed on the top surface of the filter main body 12a. The SAW filter 12-3 is formed in a substantially cuboid shape as a whole.

Figure 5B:
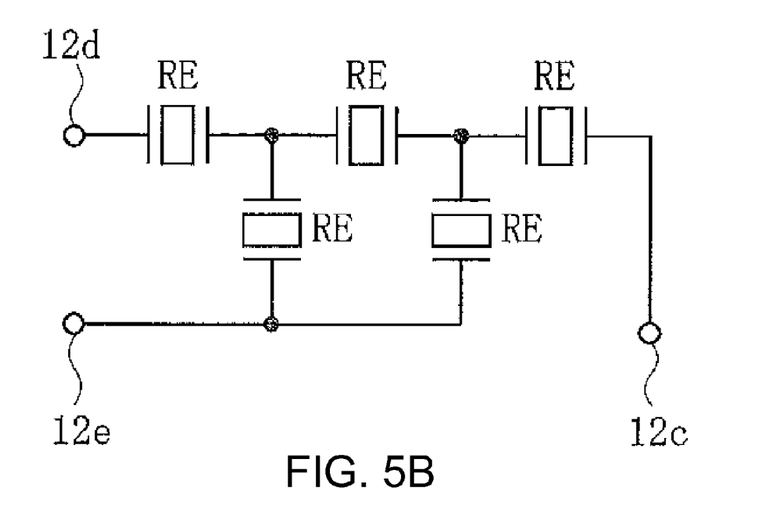
FIG. 5B is a diagram showing a configuration of a filter function section of the SAW filter shown in FIG. 5A.

As shown in FIG. 5B, the filter function section has a ladder structure in which three resonators RE are connected in series and two resonators RE are connected in parallel thereto, for example. Each resonator RE is made of a comb-shaped electrode and reflectors placed on the opposing sides thereof.

Each hollow cover 12b includes a seal ring (not shown) that is formed in a substantially rectangular frame shape and that is attached to the top surface of the filter main body 12a and a cover plate (not shown) that is attached to the seal ring to cover the top opening thereof. The height of each cover is in a range of 10 to 30 µm, for example. The seal ring and the cover plate are made of a metal such as copper, nickel, gold, or an alloy thereof. That is, the SAW filter 12-3 has a structure in which the filter function section is covered by the respective hollow covers 12b, and the filter function section is placed in hollows formed by the respective hollow covers 12b.

The sealing portion 12f is disposed on the top surface of the filter main body 12a so as to cover the respective hollow covers 12b, and the respective terminals 12c to 12e are exposed from the top surface of the sealing portion 12f. The sealing portion 12f is made of a thermoplastic material that has high humidity resistance such as liquid crystal polymers, syndiotactic polystyrene, polyphenylene sulfide, polyetheretherketone, or polyethere nitrile, and the height thereof from the top surfaces of the respective hollow covers 12b is in a range of 10 to 20 µm, for example.

This SAW filter 12-3 is housed in the housing portion 11a1 such that the respective hollow covers 12b covering the filter function section face up and such that the top surface thereof is substantially flush with the top surface of the core layer 11a. The top surface of the sealing portion 12f is covered by the first insulating layer 11c. The input terminal 12c of the SAW filter 12-3 is connected to the via conductor 11f2 that is exposed from the top surface of the substrate 11 through the via conductor 11d2. Although not shown in the figure, the output terminal 12d is also connected to the via conductor 11f2 that is exposed from the top surface of the substrate 11 through the via conductor 11d2. Also, the ground terminal 12e of the SAW filter 12-3 is connected to the stress absorbing layer 11d3 through the via conductor 11d2.

In the substrate with a built-in electronic component according to Embodiment 2, effects similar to the effects 1 to 3 described in Embodiment 1 above can be obtained.

Figure 4B:
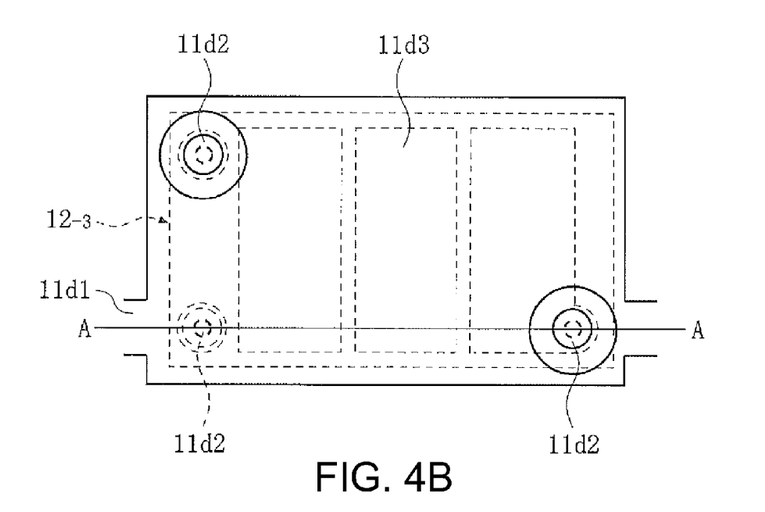
FIG. 4B is a diagram for illustrating the positional relationship of an SAW filter and a stress absorbing layer and the like in the substrate with a built-in electronic component shown in FIG. 4A.

The SAW filter 12-3 shown in FIGS. 4 and 5 is provided with a total of three hollow covers 12b, but even when the SAW filter 12-3 is replaced by an SAW filter having a total of five hollow covers 12b as shown in FIG. 3A (but not provided with a ground terminal on the cover), or an SAW filter having one hollow cover 12b as shown in FIG. 3B (but not provided with a ground terminal on the cover), that is, even when the SAW filter 12-3 is replaced by another SAW filter that has at least one hollow cover 12b (having no ground terminal thereon) that covers the filter function section, effects similar to the effects 1 to 3 above can be obtained.

The SAW filter 12-3 shown in FIGS. 4 and 5 is provided with one ground terminal 12e, but even when an SAW filter that has two or more ground terminals 12e in locations other than the top surface of the hollow cover 12b is used instead, effects similar to the effects 1 to 3 above can be obtained regardless of the number of the input terminal 12c and the output terminal 12d.

In FIG. 4, the stress absorbing layer 11d3 is shown to have a shape that is larger than the shape of the top surface of the SAW filter 12-3. However, effects similar to the effects 1 to 3 above can be obtained regardless of the outline shape or location of the stress absorbing layer 11d3 as long as the stress absorbing layer 11d3 has a shape that allows it to face at least about two thirds, more preferably, at least about three quarters of the total area of the top surface of the hollow cover 12b regardless of the number of the hollow cover 12b.

In FIGS. 4 and 5 and in the preceding paragraphs, the SAW filter 12-3 and the like were described as the elastic wave filter in which the filter function section is covered by the hollow cover. However, effects similar to the effects 1 to 3 above can be obtained even when a BAW filter or an elastic wave filter of other types that has at least one hollow cover that covers the filter function section is used instead of the SAW filter.

Embodiment 3

Figure 6A:
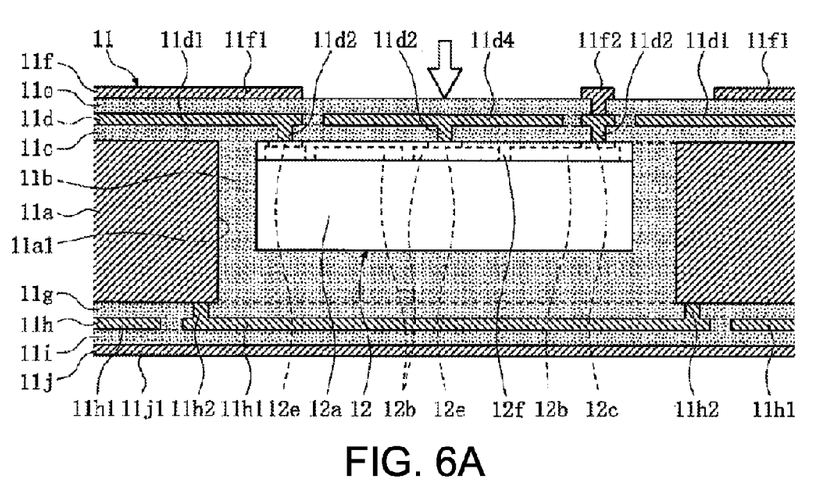
FIG. 6A is a vertical cross-sectional view of a main portion of a substrate with a built-in electronic component according to Embodiment 3 of the present invention.
Figure 6B:
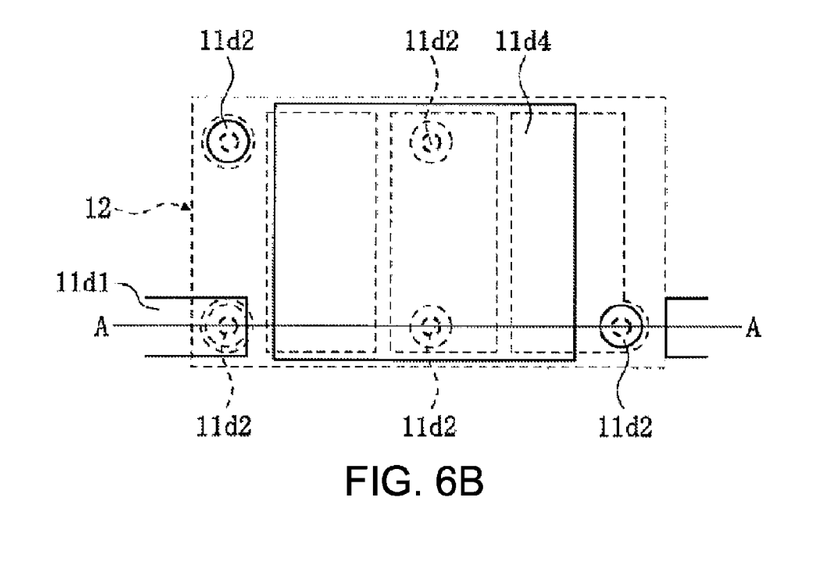
FIG. 6B is a diagram for illustrating the positional relationship of an SAW filter and a stress absorbing layer and the like in the substrate with a built-in electronic component shown in FIG. 6A.

FIGS. 6A and 6B show Embodiment 3 of the present invention (substrate with a built-in electronic component). The substrate with a built-in electronic component according to Embodiment 3 differs from the substrate with a built-in electronic component of Embodiment 1 in that the stress absorbing layer 11d3 is replaced by a stress absorbing layer 11d4 that is separated from and in no contact with the ground wiring line 11d1 that is included in the first conductive layer 11d. FIG. 6A is a cross-sectional view along the line A-A in FIG. 6B, but the cross section of the SAW filter 12 is not shown in FIG. 6A.

As shown in FIGS. 6A and 6B, the stress absorbing layer 11d4 has a substantially rectangular shape that is smaller than the shape of the top surface of the SAW filter 12. The stress absorbing layer 11d4 is not continued from the ground wiring line 11d1 that is included in the first conductive layer 11d, and is separated from and in no contact with the ground wiring line 11d1. Although not continued from the ground wiring line 11d1, the stress absorbing layer 11d4 is constituted of a part of the first conductive layer 11d, and therefore, the stress absorbing layer 11d4 is made of the same metal as the wiring line 11d1 (first conductive layer 11d), and has substantially the same thickness as that of the wiring line 11d1 (first conductive layer 11d). That is, because the stress absorbing layer 11d4 is made of the same metal as the wiring line 11d1 (first conductive layer 11d), the Young's modulus of the stress absorbing layer 11d4 is higher than the Young's modulus of the first insulating layer 11c and the second insulating layer 11e (both made of plastic). The stress absorbing layer 11d4 faces the top surfaces of the three hollow covers 12b of the SAW filter 12 in a substantially parallel manner so as to overlap about 5/6 of the top surface area thereof. Spacing between the stress absorbing layer 11d4 and the top surfaces of the hollow covers 12b substantially corresponds to a sum of the thickness of the first insulating layer 11c and the thickness of the sealing portion 12f over the top surfaces of the hollow covers 12b.

The input terminal 12c of the SAW filter 12 is connected to the via conductor 11f2 that is exposed from the top surface of the substrate 11 through the via conductor 11d2. Although not shown in the figure, the output terminal 12d is also connected to the via conductor 11f2 that is exposed from the top surface of the substrate 11 through the via conductor 11d2. Also, one of the three ground terminals 12e of the SAW filter 12 is connected to the ground wiring line 11d1 through the via conductor 11d2, and the other two are connected to the stress absorbing layer 11d4 through the via conductor 11d2.

In the substrate with a built-in electronic component according to Embodiment 3, effects similar to the effects 1 to 3 described in Embodiment 1 above can be obtained. It should be noted that because the stress absorbing layer 11d4 of this substrate with a built-in electronic component is separated from and in no contact with the ground wiring line 11d1, in order to obtain the actual ground state in the two ground terminals 12e of the SAW filter 12, which are connected to the stress absorbing layer 11d4 through the via conductor 11d2, it is necessary to provide the filter function section with a circuit configuration in which these two ground terminals 12e are connected to a ground terminal 12e that is connected to the ground wiring line 11d1.

The SAW filter 12 shown in FIG. 6 is provided with a total of three hollow covers 12b, but even when the SAW filter 12 is replaced by the SAW filter 12-1 that has a total of five hollow covers 12b (see FIG. 3A), or the SAW filter 12-2 that has one hollow cover 12b (see FIG. 3B), that is, even when the SAW filter is replaced by another SAW filter that has at least one hollow cover 12b that covers the filter function section, effects similar to the effects 1 to 3 above can be obtained. In order to obtain the actual ground state in the ground terminals 12e of the SAW filters 12-1 and 12-2, which are connected to the stress absorbing layer 11d4 through the via conductor 11d2, the above-mentioned configuration needs to be employed.

The SAW filter 12 that has three ground terminals 12e is shown in FIG. 6. However, as described in Embodiment 1 above, even when an SAW filter that has one, two, four, or more ground terminals 12e is used instead, that is, even when the SAW filter 12 is replaced by another SAW filter that has at least one ground terminal 12e on the top surface of the hollow cover 12b, effects similar to the effects 1 to 3 above can be obtained regardless of quantities of the input terminal 12c and the output terminal 12d.

In FIG. 6, the stress absorbing layer 11d4 is shown to have a shape that is smaller than the shape of the top surface of the SAW filter 12. However, effects similar to the effects 1 to 3 above can be obtained regardless of the outline shape or location of the stress absorbing layer 11d4 as long as the stress absorbing layer 11d4 has a shape that allows it to face at least about two thirds, more preferably, at least three quarters of the total area of the top surfaces of the hollow covers 12b regardless of the number of the hollow cover 12b.

In FIG. 6, the SAW filter 12 is shown as the elastic wave filter in which the filter function section is covered by the hollow cover. However, effects similar to the effects 1 to 3 above can be obtained even when a BAW filter or an elastic wave filter of other types that has at least one hollow cover that covers the filter function section is used instead of the SAW filter.

Embodiment 4

Figure 7A:
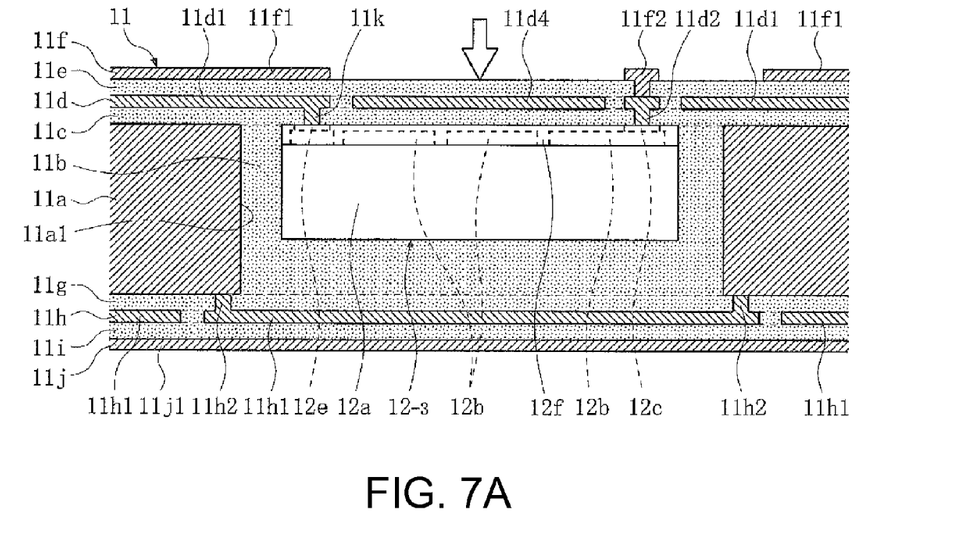
FIG. 7A is a vertical cross-sectional view of a main portion of a substrate with a built-in electronic component according to Embodiment 4 of the present invention.
Figure 7B:
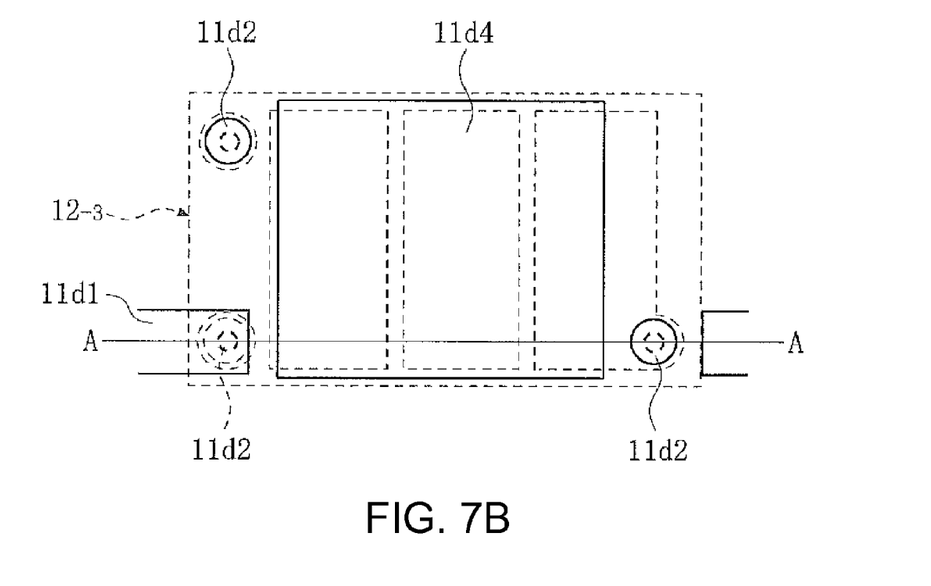
FIG. 7B is a diagram for illustrating the positional relationship of an SAW filter and a stress absorbing layer and the like in the substrate with a built-in electronic component shown in FIG. 7A.

FIGS. 7A and 7B show Embodiment 4 of the present invention (substrate with a built-in electronic component). The substrate with a built-in electronic component according to Embodiment 4 differs from the substrate with a built-in electronic component of Embodiment 3 in that the SAW filter 12 is replaced by the SAW filter 12-3 (see FIGS. 4A, 4B, 5A, 7A and 7B) that does not have a ground terminal 12e on the top surfaces of a total of three hollow covers 12b. FIG. 7A is a cross-sectional view along the line A-A in FIG. 7B, but the cross section of the SAW filter 12-3 is not shown in FIG. 7A. The configuration and the like of the SAW filter 12-3 are the same as those described in Embodiment 2 above, and therefore, the descriptions thereof are omitted.

In the substrate with a built-in electronic component according to Embodiment 4, effects similar to the effects 1 to 3 described in Embodiment 1 above can be obtained.

The SAW filter 12-3 shown in FIG. 7 is provided with a total of three hollow covers 12b, but even when the SAW filter 12-3 is replaced by an SAW filter having a total of five hollow covers 12b as shown in FIG. 3A (but not provided with a ground terminal on the cover), or an SAW filter having one hollow cover 12b as shown in FIG. 3B (but not provided with a ground terminal on the cover), that is, even when the SAW filter 12-3 is replaced by another SAW filter that has at least one hollow cover 12b (having no ground terminal thereon) that covers the filter function section, effects similar to the effects 1 to 3 above can be obtained.

The SAW filter 12-3 shown in FIG. 7 is provided with one ground terminal 12e. However, as described in Embodiment 2 above, even when the SAW filter 12-3 is replaced by an SAW filter 12 that has two or more ground terminals 12e in locations other than the top surfaces of the hollow covers 12b, effects similar to the effects 1 to 3 can be obtained regardless of quantities of the input terminal 12c and the output terminal 12d.

In FIG. 7, the stress absorbing layer 11d4 is shown to have a shape that is smaller than the shape of the top surface of the SAW filter 12-3. However, effects similar to the effects 1 to 3 above can be obtained regardless of the outline shape or location of the stress absorbing layer 11d4 as long as the stress absorbing layer 11d4 has a shape that allows it to face at least about two thirds, more preferably, at least three quarters of the total area of the top surfaces of the hollow covers 12b regardless of the number of the hollow cover 12b.

In FIG. 7 and in the preceding paragraphs, the SAW filter 12-3 and the like were described as the elastic wave filter in which the filter function section is covered by the hollow cover. However, effects similar to the effects 1 to 3 above can be obtained even when a BAW filter or an elastic wave filter of other types that has at least one hollow cover that covers the filter function section is used instead of the SAW filter.

Other Embodiments (1) In Embodiments 3 and 4 above, the stress absorbing layer 11d4 was separated from and in no contact with the ground wiring line 11d1 that is included in the first conductive layer 11d. In such substrates with built-in electronic components, it is possible to form the stress absorbing layer 11d4 of a material that is different from that of the first conductive layer 11d. For example, the stress absorbing layer 11d4 can be formed by preparing a layered body that has a shape and a thickness that substantially correspond to those of the stress absorbing layer 11d4 using an insulating material such as ceramics or glass that has a higher Young's modulus than the Young's modulus of the first insulating layer 11c and the second insulating layer 11e, placing the layered body in a prescribed location on the first insulating layer 11c, and thereafter forming the second insulating layer 11e. Alternatively, the layered body can be directly formed in the prescribed location on the first insulating layer 11c through paste coating, baking, and the like before forming the second insulating layer 11e. This way, the stress absorbing layer 11d4 can be made of a material different from that of the first conductive layer 11d, and effects similar to the effects 1 and 2 above can be obtained.

(2) In Embodiments 1 to 4 above, the core layer 11a of the substrate 11 has the substantially cuboid-shaped housing portion 11a1 that is formed to penetrate the core layer 11a, but the shape of the housing portion 11a1 is not limited to the substantially cuboid shape as long as a prescribed elastic wave filter can be placed therein. Even when a recess is formed in the core layer 11a as the housing portion, instead of the housing portion 11a1 that penetrates the core layer 11a, and an elastic wave filter is housed in such a housing portion, effects similar to the effects 1 to 3 above can be obtained.

(3) In Embodiments 1 to 4 above, the substrate 11 is provided with two insulating layers 11c and 11e and two conductive layers 11d and 11f above the core layer 11a, and two insulating layers 11g and 11i and two conductive layers 11h and 11j below the core layer 11a. However, effects similar to the effects 1 to 3 above can be obtained even when the second insulating layer 11e and the second conductive layer 11f are not provided above the core layer 11a, or when an insulating layer and a conductive layer are further provided on the second conductive layer 11f above the core layer 11a. In terms of the insulating layers and the conductive layers below the core layer 11a, it is apparent that effects similar to the effects 1 to 3 can be obtained even when the number of layers is increased or decreased as needed.

(4) In Embodiments 1 to 4 above, the core layer 11a of the substrate 11 is made of a metal. However, effects similar to the effects 1 to 3 above can be obtained even when a core layer that is made of an insulating material such as plastic and that has the same thickness as that of the core layer 11a is used instead, or even when the core layer is formed by laminating the same insulating layers as the respective insulating layers 11c, 11e, 11g, and 11i.

DESCRIPTION OF REFERENCE CHARACTERS 11 substrate
11a core layer
11a1 housing portion
11b part fixing portion
11c, 11e, 11g, 11i insulating layer
11d, 11f, 11h, 11j conductive layer
11d1, 11f1, 11h1, 11j1 wiring line
11d2, 11f2, 11h2 via conductor
11d3, 11d4 stress absorbing layer
12, 12-1, 12-2, 12-3 SAW filter
12a filter main body
12b hollow cover
12c to 12e terminal
12f sealing portion

The invention claimed is:

1. A substrate with a built-in electronic component, comprising:
   an elastic wave filter built into a substrate, a filter function section of the elastic wave filter being covered by a hollow cover; and
   a stress absorbing layer that faces the hollow cover of the elastic wave filter through an insulating layer in the substrate.

2. The substrate with a built-in electronic component according to claim 1, wherein the stress absorbing layer is substantially in parallel with the hollow cover of the elastic wave filter.

3. The substrate with a built-in electronic component according to claim 1, wherein the Young's modulus of the stress absorbing layer is higher than the Young's modulus of the insulating layer.

4. The substrate with a built-in electronic component according to claim 1, wherein the stress absorbing layer is made of a part of a conductive layer that is formed on the insulating layer.

5. The substrate with a built-in electronic component according to claim 4, wherein the stress absorbing layer is formed continuously from a wiring line that is included in the conductive layer.

6. The substrate with a built-in electronic component according to claim 4, wherein the stress absorbing layer is separated from and in no contact with a wiring line that is included in the conductive layer.

7. The substrate with a built-in electronic component according to claim 1, wherein the stress absorbing layer is a layered body that is made of a material different from that of the conductive layer, and is separated from and in no contact with a wiring line that is included in the conductive layer.

8. The substrate with a built-in electronic component according to claim 1, wherein the elastic wave filter has at least one ground terminal that is connected to the hollow cover.

* * * * *